US012575189B2

(12) United States Patent
Ajay et al.

(10) Patent No.: US 12,575,189 B2
(45) Date of Patent: Mar. 10, 2026

(54) SILICON-CONTROLLED RECTIFIERS WITH A SEGMENTED FLOATING REGION

(71) Applicant: GlobalFoundries U.S. Inc., Malta, NY (US)

(72) Inventors: Ajay, Aligarh (IN); Ruchil Kumar Jain, Dresden (DE); Prantik Mahajan, Dresden (DE); Alban Zaka, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 685 days.

(21) Appl. No.: 17/946,089

(22) Filed: Sep. 16, 2022

(65) Prior Publication Data

US 2024/0096868 A1    Mar. 21, 2024

(51) Int. Cl.
H10D 89/60        (2025.01)
H10D 18/00        (2025.01)

(52) U.S. Cl.
CPC ........... H10D 89/60 (2025.01); H10D 18/251 (2025.01)

(58) Field of Classification Search
CPC .............................. H10D 89/60; H10D 18/251
USPC ........................................................ 257/173
See application file for complete search history.

(56) References Cited

U.S. PATENT DOCUMENTS 7,719,026 B2    5/2010  Lou et al.
2019/0123039 A1  4/2019  Mallikarjunaswamy

FOREIGN PATENT DOCUMENTS

CN    114068525 A  *  2/2022  ........... H10D 89/713
CN    114121943 A     3/2022

OTHER PUBLICATIONS

W. Song et al., "Design of a Novel Low Voltage Triggered Silicon Controlled Rectifier (SCR) for ESD Applications," 2020 International EOS/ESD Symposium on Design and System (IEDS), Chengdu, China, 2021, pp. 1-4, doi: 10.23919/IEDS48938.2021.9468851.
European Patent Office, Extended European Search Report and Opinion issued in European Patent Application No. 23186567.6 on Feb. 6, 2024; 9 pages.

(Continued)

*Primary Examiner* — Eric W Jones
*Assistant Examiner* — Colin Russell McCutcheon
(74) *Attorney, Agent, or Firm* — Thompson Hine LLP; Francois Pagette

(57)        ABSTRACT

Structures for a silicon-controlled rectifier and methods of forming same. The structure comprises a first well, a second well, and a third well in a semiconductor substrate. The third well is positioned between the first well and the second well. A first terminal includes a first doped region in the first well, and a second terminal includes a second doped region in the second well. The first well, the second well, and the second doped region have a first conductivity type, and the third well and the first doped region have a second conductivity type opposite to the first conductivity type. The structure further comprises a third doped region in the third well. The third doped region includes a first segment and a second segment, and the first segment is separated from the second segment by a portion of the first well and a portion of the third well.

20 Claims, 8 Drawing Sheets

(56) References Cited

OTHER PUBLICATIONS

Ming-Dou Ker and K. C. Hsu, "Overview of on-chip electrostatic discharge protection design with SCR-based devices in CMOS integrated circuits," in IEEE Transactions on Device and Materials Reliability, vol. 5, No. 2, pp. 235-249, Jun. 2005, doi: 10.1109/TDMR.2005.846824.

V. A. Vashchenko, V. Kuznetsov and P. J. Hopper, "Implementation of dual-direction SCR devices in analog CMOS process," 2007 29th Electrical Overstress/Electrostatic Discharge Symposium (EOS/ESD), 2007, pp. 1B.5-1-1B.5-5, doi: 10.1109/EOSESD.2007.4401734.

Feibo Du et al., "Bidirectional silicon-controlled rectifier for advanced ESD protection applications," Electronic Letters, vol. 55, Issue 2, pp. 112-114; https://doi.org/10.1049/el.2018.6686 (Jan. 1, 2019).

Ganesan, Vishal et al., "Silicon-Controlled Rectifiers for Electrostatic Discharge Protection" filed on Jul. 5, 2022 as a U.S. Appl. No. 17/857,439.

Mahajan, Prantik et al., "Gated Protection Device Structures for an Electrostatic Discharge Protection Circuit" filed on Sep. 1, 2022 as a U.S. Appl. No. 17/901,015.

European Patent Office; Communication under Rule 71(3) EPC, Intention to Grant, issued in European Patent Application No. 23186567.6 on Oct. 22, 2025; 8 pages.

* cited by examiner

SILICON-CONTROLLED RECTIFIERS WITH A SEGMENTED FLOATING REGION

BACKGROUND

The disclosure relates generally to semiconductor devices and integrated circuit fabrication and, more specifically, to structures for a silicon-controlled rectifier and methods of forming a structure for a silicon-controlled rectifier.

An integrated circuit may be exposed to random electrostatic discharge (ESD) events that can direct potentially large and damaging ESD currents to the sensitive devices of the integrated circuit. An ESD event refers to an unpredictable electrostatic discharge during which a high current is directed over a short duration toward the integrated circuit. An ESD event may occur during post-manufacture chip handling or after chip installation on a circuit board or other carrier. An ESD event may originate from a variety of sources, such as the human body, a machine component, or a chip carrier.

Precautions may be taken to protect an integrated circuit from an ESD event. One such precaution is an on-chip protection circuit that is designed to avert damage to the sensitive devices of the integrated circuit during an ESD event. If an ESD event occurs, a protection device of the protection circuit is triggered to enter a low-impedance state that conducts the ESD current to ground and thereby shunts the ESD current away from the sensitive devices of the integrated circuit. The protection device remains clamped in its low-impedance state until the ESD current is drained and the ESD voltage is discharged to an acceptable level.

A common type of protection device deployed in an ESD protection circuit is a silicon-controlled rectifier (SCR). In its quiescent high-impedance state, the SCR restricts current conduction to leakage current. However, a voltage pulse exceeded an engineered threshold, known as the trigger voltage, initiates the conduction of a forward current between the anode and cathode of the SCR. Even after the trigger voltage is removed, the SCR remains clamped in its low-impedance state so long as the forward current remains above another engineered threshold, known as the holding current. When the forward current associated with the ESD event drops below the holding current, the SCR returns to its quiescent high-impedance state.

Improved structures for a silicon-controlled rectifier and methods of forming a structure for a silicon-controlled rectifier are needed.

SUMMARY

In an embodiment, a structure for a silicon-controlled rectifier is provided. The structure comprises a first well, a second well, and a third well in a semiconductor substrate. The first well and the second well have a first conductivity type, and the third well has a second conductivity type opposite to the first conductivity type. The third well is positioned between the first well and the second well. The structure further comprises a first terminal including a first doped region in the first well and a second terminal including a second doped region in the second well. The first doped region has the second conductivity type, and the second doped region has the first conductivity type. The structure further comprises a third doped region in the third well. The third doped region includes a first segment and a second segment, and the first segment is separated from the second segment by a portion of the first well and a portion of the third well.

In an embodiment, a structure for a silicon-controlled rectifier is provided. The structure comprises a first well and a second well in a semiconductor substrate. The first well has a first conductivity type, and the second well has a second conductivity type opposite to the first conductivity type. The second well adjoins the first well. The structure further comprises a first terminal including a first doped region in the first well and a second terminal including a second doped region in the second well. The first doped region has the second conductivity type, and the second doped region has the first conductivity type. The structure further comprises a third doped region including a first segment and a second segment. The first segment is separated from the second segment by a portion of the first well and a portion of the second well. The first segment and the second segment each includes a first portion and a second portion of which the first portion is located in the first well and the second well, and the second portion is located in the first well.

In an embodiment, a method of forming a structure for a silicon-controlled rectifier is provided. The method comprises forming a first well, a second well, and a third well in a semiconductor substrate. The first well and the second well have a first conductivity type, and the third well has a second conductivity type opposite to the first conductivity type. The third well is positioned between the first well and the second well. The method further comprises forming a first terminal including a first doped region in the first well, and forming a second terminal including a second doped region in the second well. The first doped region has the second conductivity type, and the second doped region has the first conductivity type. The method further comprises forming a third doped region in the third well. The third doped region includes a first segment and a second segment, and the first segment is separated from the second segment by a portion of the first well and a portion of the third well.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
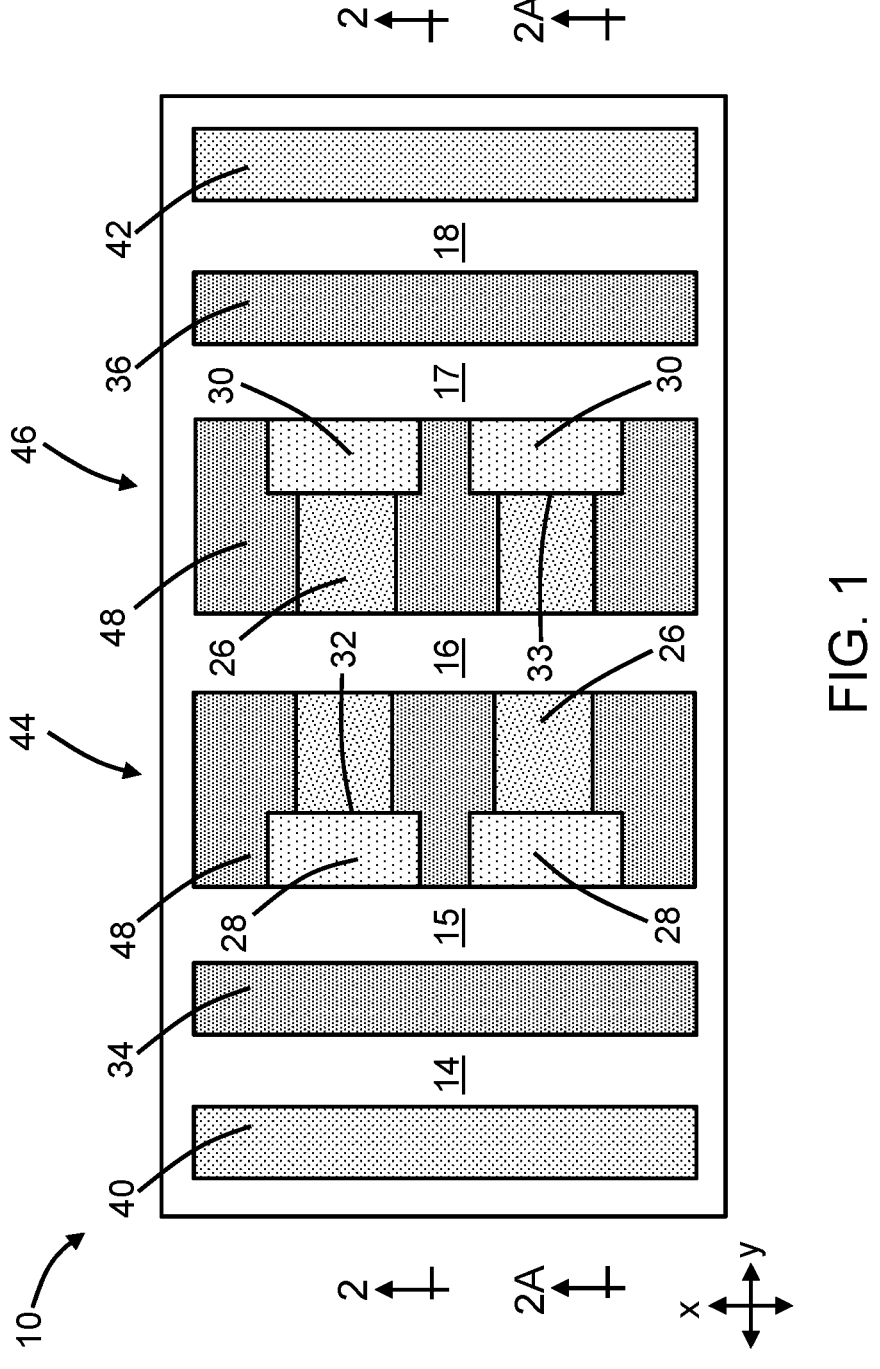
FIG. 1 is a top view of a structure in accordance with embodiments of the invention.
Figure 2:
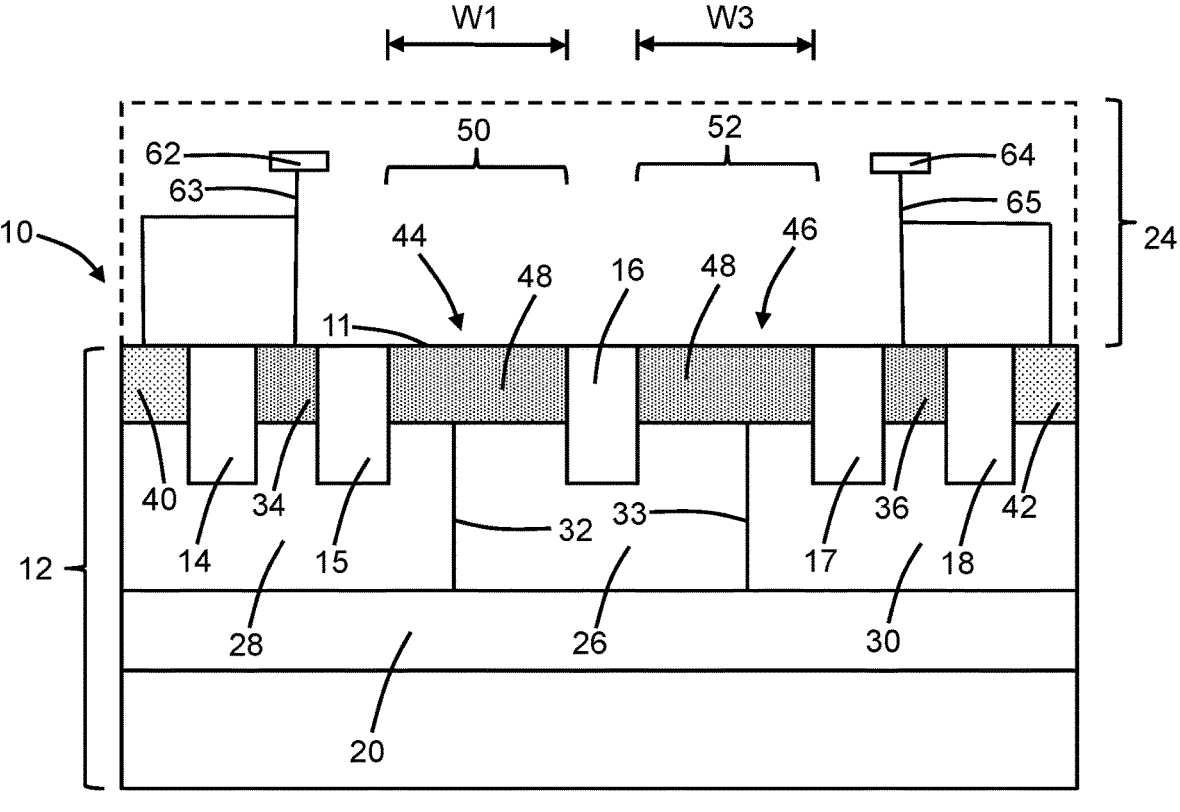
FIG. 2 is a cross-sectional view taken generally along line 2-2 in FIG. 1.
Figure 2A:
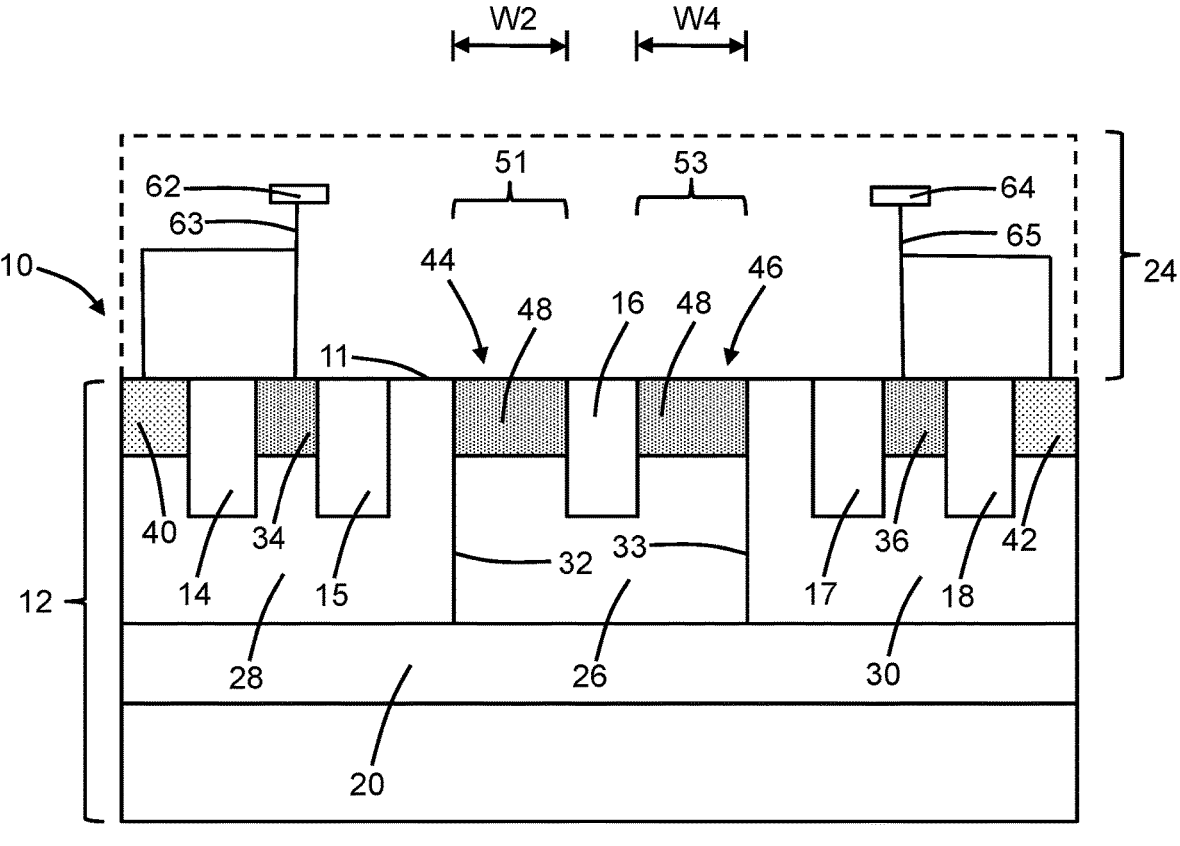
FIG. 2A is a cross-sectional view taken generally along line 2A-2A in FIG. 1.

With reference to FIGS. 1, 2, 2A and in accordance with embodiments of the invention, a structure 10 for a silicon-controlled rectifier includes a semiconductor substrate 12 that may be comprised of a semiconductor material, such as single-crystal silicon. The semiconductor substrate 12 may be initially doped, before subsequent processing, to have, for example, p-type conductivity. Shallow trench isolation regions 14, 15, a shallow trench isolation region 16, and shallow trench isolation regions 17, 18 are arranged in different portions of the semiconductor substrate 12. The shallow trench isolation regions 14-18 may be formed by patterning shallow trenches in the semiconductor substrate 12 with lithography and etching processes, depositing a dielectric material, such as silicon dioxide, in the shallow trenches, and planarizing and/or recessing the deposited dielectric material.

A deep well 20 is positioned in the semiconductor substrate 12. The portion of the semiconductor substrate 12 beneath the deep well 20 has an opposite conductivity type from the deep well 20. In an embodiment, the deep well 20 may be doped with a concentration of an n-type dopant (e.g., arsenic or phosphorus) to provide n-type conductivity. The deep well 20 may be formed by introducing a dopant by, for example, ion implantation into the semiconductor substrate 12. The implantation conditions (e.g., ion species, dose, kinetic energy) may be selected to tune the electrical and physical characteristics of the deep well 20. The deep well 20 isolates the silicon-controlled rectifier from the portion of the semiconductor substrate 12 beneath the deep well 20.

A well 26 is positioned in the semiconductor substrate 12. In an embodiment, the well 26 may be positioned in a vertical direction between the deep well 20 and the top surface 11 of the semiconductor substrate 12, and the well 26 may adjoin the deep well 20 along an interface. In an embodiment, the well 26 may be doped with a concentration of an n-type dopant (e.g., arsenic or phosphorus) to provide n-type conductivity. In an embodiment, the well 26 may be doped to have the same conductivity type as the deep well 20 but at a lower dopant concentration than the deep well 20.

The well 26 may be formed by introducing a dopant by, for example, ion implantation into the semiconductor substrate 12. A patterned implantation mask may be formed to define a selected area on the top surface 11 of the semiconductor substrate 12 that is exposed for the implantation of ions. The implantation mask may include a layer of an organic photoresist that is applied and patterned to form an opening exposing the selected area on the top surface 11 of the semiconductor substrate 12 and determining, at least in part, the location and horizontal dimensions of the well 26. The implantation mask has a thickness and stopping power sufficient to block the implantation of ions in masked areas. The implantation conditions (e.g., ion species, dose, kinetic energy) may be selected to tune the electrical and physical characteristics of the well 26.

Wells 28, 30 are positioned in the semiconductor substrate 12. In an embodiment, the wells 28, 30 may be positioned in a vertical direction between the deep well 20 and the top surface 11 of the semiconductor substrate 12, and the wells 28, 30 may adjoin the deep well 20 along respective interfaces. The well 26 is positioned in a lateral direction between the well 28 and the well 30. The well 26 adjoins the well 28 along an interface 32, and the well 26 adjoins the well 30 along an interface 33. The interfaces 32, 33 are positioned in a vertical direction between the deep well 20 and the top surface 11 of the semiconductor substrate 12.

The wells 28, 30 may be formed by introducing a dopant of a given conductivity type by, for example, ion implantation into the semiconductor substrate 12. A patterned implantation mask may be formed to define selected areas on the top surface 11 of the semiconductor substrate 12 that are exposed for the implantation of ions. The implantation mask may include a layer of an organic photoresist that is applied and patterned to form openings exposing the selected areas on the top surface 11 of the semiconductor substrate 12 and determining, at least in part, the location and horizontal dimensions of the wells 28, 30. The implantation mask has a thickness and stopping power sufficient to block the implantation of ions in masked areas. The implantation conditions (e.g., ion species, dose, kinetic energy) may be selected to tune the electrical and physical characteristics of the wells 28, 30. The wells 28, 30 are doped to have an opposite conductivity type from the well 26. In an embodiment, the wells 28, 30 may be doped with a concentration of a p-type dopant (e.g., boron) to provide p-type conductivity.

A doped region 34 is positioned in the well 28, and a doped region 36 is positioned in the well 30. The doped regions 34, 36 are located in a vertical direction adjacent to the top surface 11 of the semiconductor substrate 12. The doped regions 34, 36 may be doped to have an opposite conductivity type from the wells 28, 30. In an embodiment, the doped regions 34, 36 may be doped (e.g., heavily doped) with a concentration of an n-type dopant (e.g., arsenic or phosphorus) to provide n-type conductivity. The doped regions 34, 36 may be concurrently formed by selectively implanting ions, such as ions including the n-type dopant, with an implantation mask having openings defining the intended locations for the doped regions 34, 36 in the semiconductor substrate 12.

A doped region 40 is positioned in the well 28, and a doped region 42 is positioned in the well 30. The doped regions 40, 42 are located in a vertical direction adjacent to the top surface 11 of the semiconductor substrate 12. The doped region 40 and the doped region 42 may be doped to have the same conductivity type as the wells 28, 30 but at a higher dopant concentration. In an embodiment, the doped regions 40, 42 may be doped (e.g., heavily doped) with a concentration of a p-type dopant (e.g., boron) to provide p-type conductivity. The doped regions 40, 42 may be concurrently formed by selectively implanting ions, such as ions including the p-type dopant, with an implantation mask having openings defining the intended locations for the doped regions 40, 42 in the semiconductor substrate 12. The shallow trench isolation region 14 is positioned between the doped region 34 and the doped region 40. The shallow trench isolation region 18 is positioned between the doped region 36 and the doped region 42.

Doped regions 44, 46 are positioned adjacent to the top surface 11 of the semiconductor substrate 12. Each of the doped regions 44, 46 includes sections or segments 48 that have a spaced arrangement. In an embodiment, the segments 48 may be doped with a concentration of an n-type dopant (e.g., arsenic or phosphorus) to provide n-type conductivity. The segments 48 may be doped to have the same conductivity type as the well 26 but at a higher dopant concentration than the well 26, and the segments 48 may be doped to have an opposite conductivity type from the wells 28, 30. The shallow trench isolation region 16 is positioned in a lateral direction between the segments 48 of the doped region 44 and the segments 48 of the doped region 46. The shallow trench isolation region 15 is positioned in a lateral direction (e.g., a y-direction) between the segments 48 of the doped region 44 and the doped region 34, and the shallow trench isolation region 17 is positioned in a lateral direction (e.g., a y-direction) between the segments 48 of the doped region 46 and the doped region 36. A portion of the well 26 and a portion of the well 28 are positioned in a lateral direction (e.g., an x-direction) between adjacent pairs of segments 48 to jointly provide the segmentation of the doped region 44. The portions of the wells 26, 28 and the segments 48 alternate in a lateral direction (e.g., a y-direction). A portion of the well 26 and a portion of the well 30 are positioned in a lateral direction (e.g., an x-direction) between adjacent pairs of segments 48 to jointly provide the segmentation of the doped region 46. The portions of the wells 26, 30 and the segments 48 alternate in a lateral direction (e.g., a y-direction).

Each segment 48 of the doped region 44 includes a portion 50 having a width dimension W1, and each segment 48 of the doped region 44 includes a portion 51 having a width dimension W2 that is less than the width dimension W1. The portion 50 of each segment 48 extends fully from the shallow trench isolation region 15 to the shallow trench isolation region 16, and the portion 50 abuts each of the shallow trench isolation regions 15, 16. The portion of the well 28 disposed between the portion 51 of each segment 48 and the shallow trench isolation region 15 has a width dimension equal to a difference between the width dimension W1 and the width dimension W2. The portion of the well 26 positioned between the portions 51 of adjacent pairs of the segments 48 has a width dimension equal to the width dimension W2. The portions of the wells 26, 28 between adjacent pairs of segments 48 extend fully as strips from the shallow trench isolation region 15 to the shallow trench isolation region 16 and therefore have a width dimension equal to the width dimension W1.

Each segment 48 of the doped region 46 includes a portion 52 having a width dimension W3, and each segment 48 of the doped region 46 includes a portion 53 having a width dimension W4 that is less than the width dimension W3. The portion 52 of each segment 48 extends fully from the shallow trench isolation region 16 to the shallow trench isolation region 17, and the portion 52 abuts each of the shallow trench isolation regions 16, 17. The portion of the well 30 disposed between the portion 53 of each segment 48 and the shallow trench isolation region 17 has a width dimension equal to a difference between the width dimension W3 and the width dimension W4. The portion of the well 26 positioned between the portions 53 of adjacent pairs of the segments 48 has a width dimension equal to the width dimension W4. The portions of the wells 26, 30 between adjacent pairs of segments 48 extend fully as strips from the shallow trench isolation region 16 to the shallow trench isolation region 17 and therefore have a width dimension equal to the width dimension W3.

The segments 48 of the doped regions 44, 46 may be formed by masked ion implantation concurrently with the formation of the doped regions 34, 36. Portions of the well 26 and portions of the wells 28, 30 are masked during the implantations to provide the portioning of the segments 48 of the doped region 44 into portions 50, 51 and the portioning of the segments 48 of the doped region 46 into portions 52, 53. In an embodiment, the width dimension W1 of the portions 50 may be equal to the width dimension W3 of the portions 52, and the width dimension W2 of the portions 51 may be equal to the width dimension W4 of the portions 53.

The portion 50 of each segment 48 of the doped region 44 extends laterally across (i.e., bridges) the p-n junction along the interface 32 between the well 26 and the well 28. The portion 51 of each segment 48 of the doped region 44 extends shares a boundary with (i.e., is coextensive with) the p-n junction along the interface 32 between the well 26 and the well 28. The portion 52 of each segment 48 of the doped region 46 extends laterally across (i.e., bridges) the p-n junction along the interface 33 between the well 26 and the well 30. The portion 53 of each segment 48 of the doped region 46 extends shares a boundary with (i.e., is coextensive with) the p-n junction along the interface 33 between the well 26 and the well 30.

Middle-of-line processing and back-end-of-line processing follow, which includes formation of an interconnect structure 24 with electrical connections coupled to the silicon-controlled rectifier. The doped regions 44, 46 are not coupled to electrical connections in the interconnect structure 24 and, for that reason, are configured to be electrically floating. The doped regions 34, 40 may be coupled together by an electrical connection 63 in the interconnect structure 24 to define a terminal 62 of the structure 10, and the doped regions 36, 42 may be coupled together by an electrical connection 65 in the interconnect structure 24 to define another terminal 64 of the structure 10. The terminals 62, 64 provide an anode and a cathode of the silicon-controlled rectifier.

The structure 10 may embody a fully-isolated symmetrical bidirectional device structure for a silicon-controlled rectifier that is suitable for use as electrostatic discharge protection device. In use, the structure 10 may be characterized by a current path when triggered by the occurrence of an electrostatic discharge event received at the terminal 62. The current of the electrostatic discharge event may be directed to the terminal 64 in an NPNP current path from the doped region 34 of the terminal 62 through the well 28, the deep well 20, and the well 30 to the doped region 42 of the terminal 64. Because the device structure is bi-directional, the structure 10 may alternatively be characterized by a current path when triggered by the occurrence of an electrostatic discharge event that is received at the terminal 64. The current of the electrostatic discharge event may be directed to the terminal 64 in an NPNP current path from the doped region 36 of the terminal 64 through the well 30, the deep well 20, and the well 28 to the doped region 40 of the terminal 62.

The doped regions 44, 46 are not connected to either of the terminals 62, 64 and are configured to be electrically floating due to the lack of a connection in the interconnect structure 24. The floating doped regions 44, 46 with the fully-portioned segments 48 may function to reduce the trigger voltage, in comparison with conventional silicon-controlled rectifiers, without compromising the failure current due to thermal breakdown. The portions 51 have localized abrupt junctions with the well 28 that are coextensive with the interface 32, and the portions 53 have localized abrupt junctions with the well 30 that are coextensive with the interface 33. These abrupt junctions locally shift the locations at which the maximum impact ionization occurs.

Figure 3:
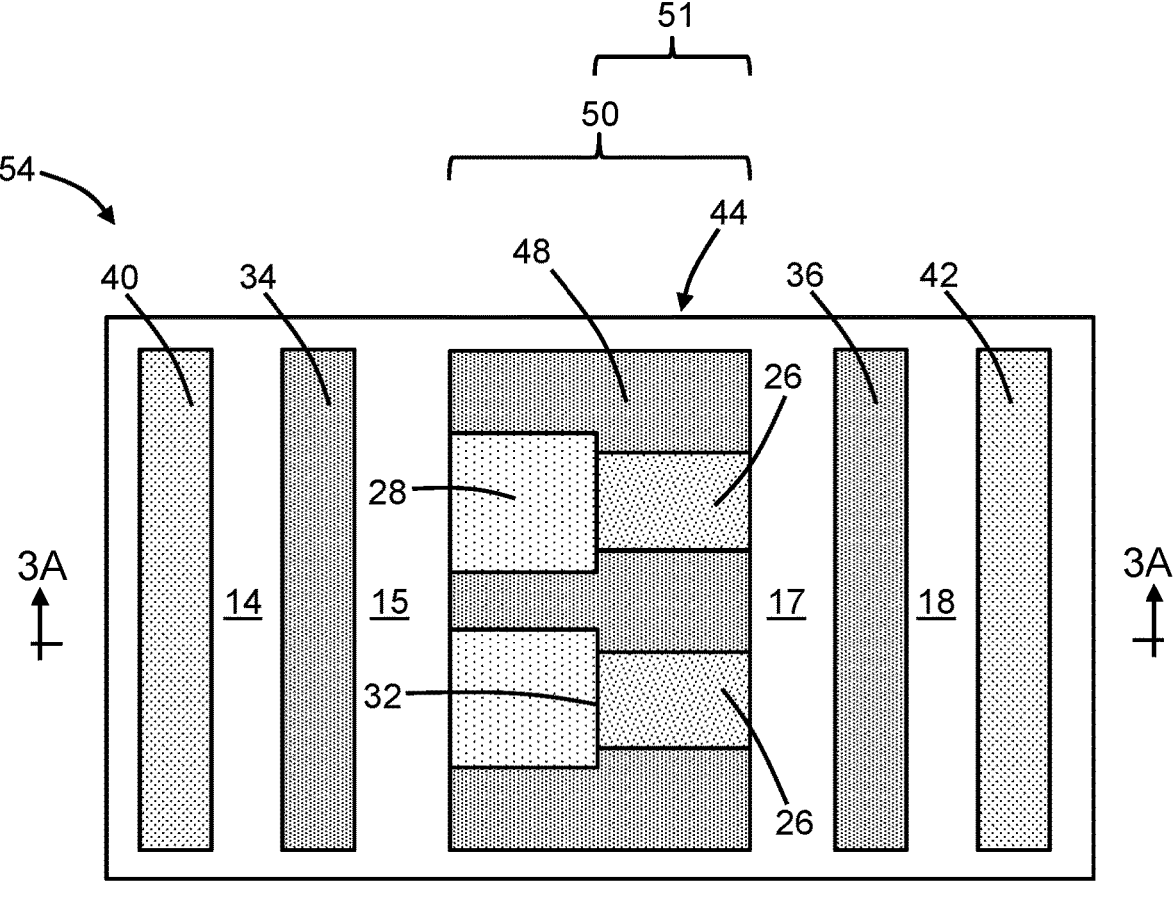
FIG. 3 is a top view of a structure in accordance with alternative embodiments of the invention.
Figure 3A:
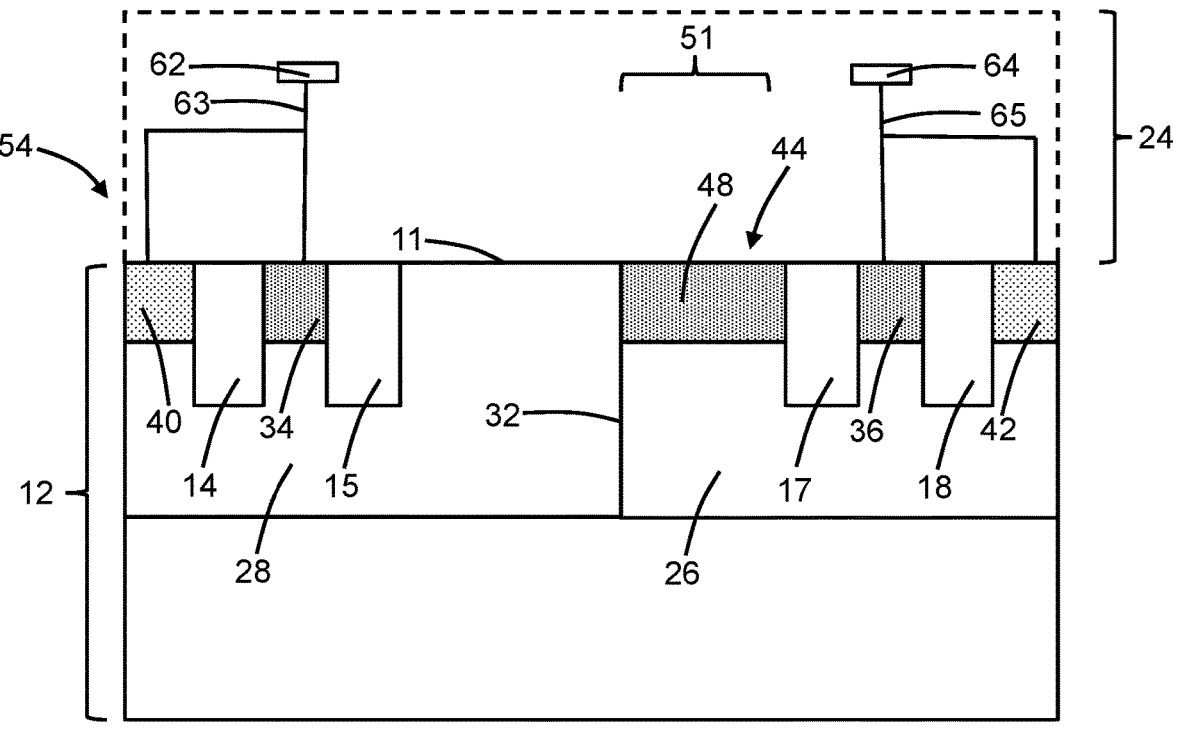
FIG. 3A is a cross-sectional view taken generally along line 3A-3A in FIG. 3.

With reference to FIGS. 3, 3A and in accordance with alternative embodiments of the invention, a structure 54 for a unidirectional silicon-controlled rectifier by eliminating the doped region 46 of the structure 10 (FIG. 1) such that only the doped region 44 remains. The deep well 20 and the well 30 are also eliminated, and the doped regions 36, 42 of the terminal 64 are positioned in the well 26. The shallow trench isolation region 16 is also eliminated such that the segments 48 of the doped region 44 are positioned in a lateral direction between the shallow trench isolation region 15 and the shallow trench isolation region 17. The segments 48 of the doped region 44 include the portions 51 that provide the localized abrupt junctions with the well 26 along the interface 32, as well as the portions 50 that are wider than the portions 51 and bridge across the interface 32.

Figure 4:
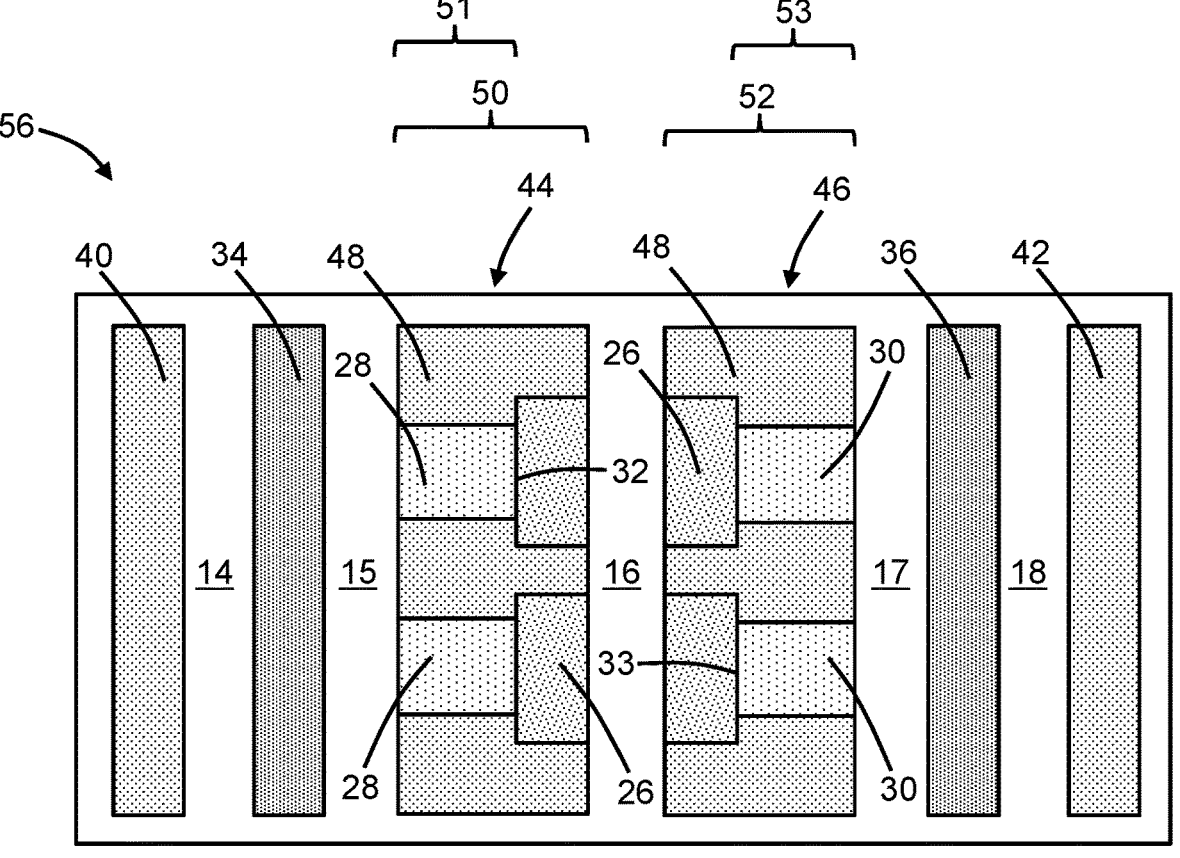
FIG. 4 is a top view of a structure in accordance with alternative embodiments of the invention.

With reference to FIG. 4 and in accordance with alternative embodiments of the invention, a structure 56 for a bidirectional silicon-controlled rectifier modifies the structure 10 (FIG. 1) to relocate the portions 51 of the segments 48 of the doped region 44 to positions that are adjacent to the shallow trench isolation region 15, and relocate the portions 53 of the segments 48 of the doped region 46 to positions adjacent to the shallow trench isolation region 17. A portion of the well 26 is positioned between each portion 51 and the shallow trench isolation region 16. A portion of the well 26 is positioned between each portion 53 and the shallow trench isolation region 16. The shallow trench isolation region 16 is positioned between, and may adjoin, the portions 50 of the segments 48 of the doped region 44 and the portions 52 of the segments 48 of the doped region 46. In an embodiment, the segments 48 may be doped with a concentration of a p-type dopant (e.g., arsenic or phosphorus) to provide p-type conductivity. The portions 51 have localized abrupt junctions with the well 26 that are coextensive with the interface 32, and the portions 53 have localized abrupt junctions with the well 26 that are coextensive with the interface 33. The portions 50, which are wider than the portions 51, bridge across the interface 31, and the portions 52, which are wider than the portions 53, bridge across the interface 33.

Figure 5:
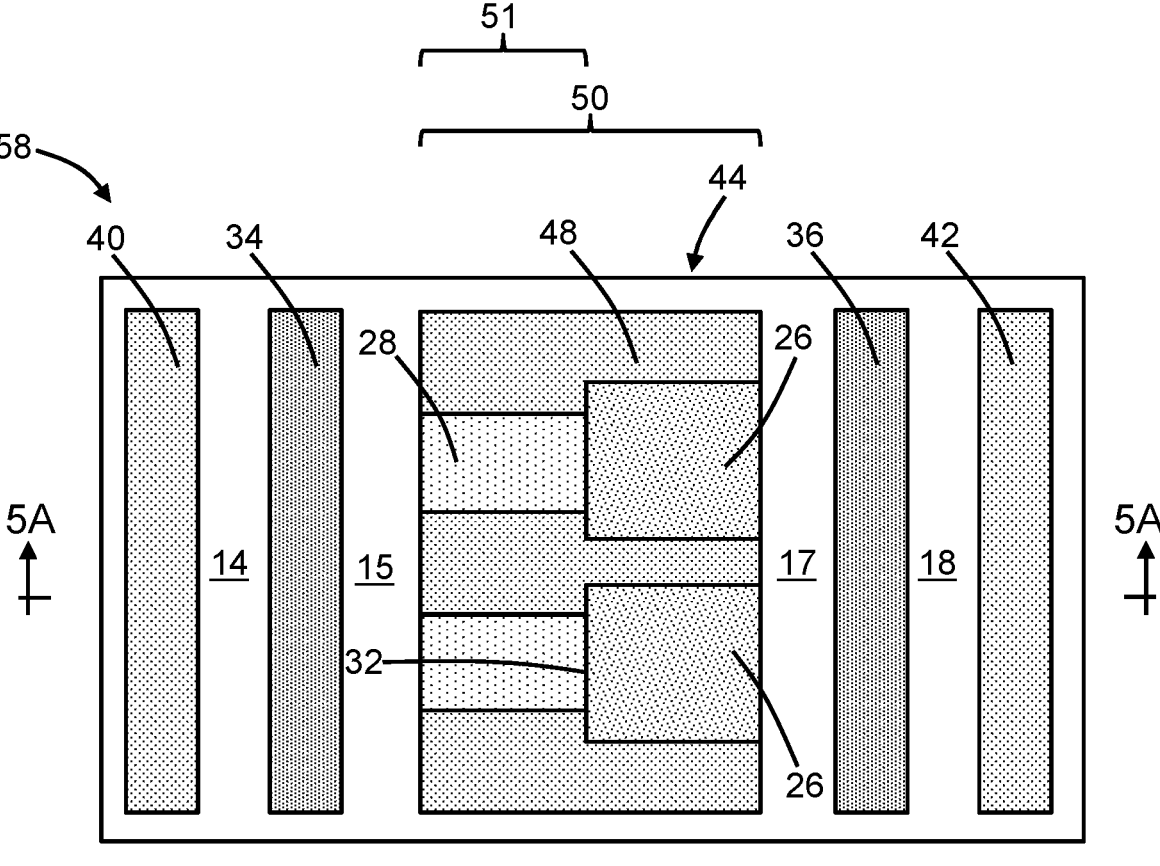
FIG. 5 is a top view of a structure in accordance with alternative embodiments of the invention.
Figure 5A:
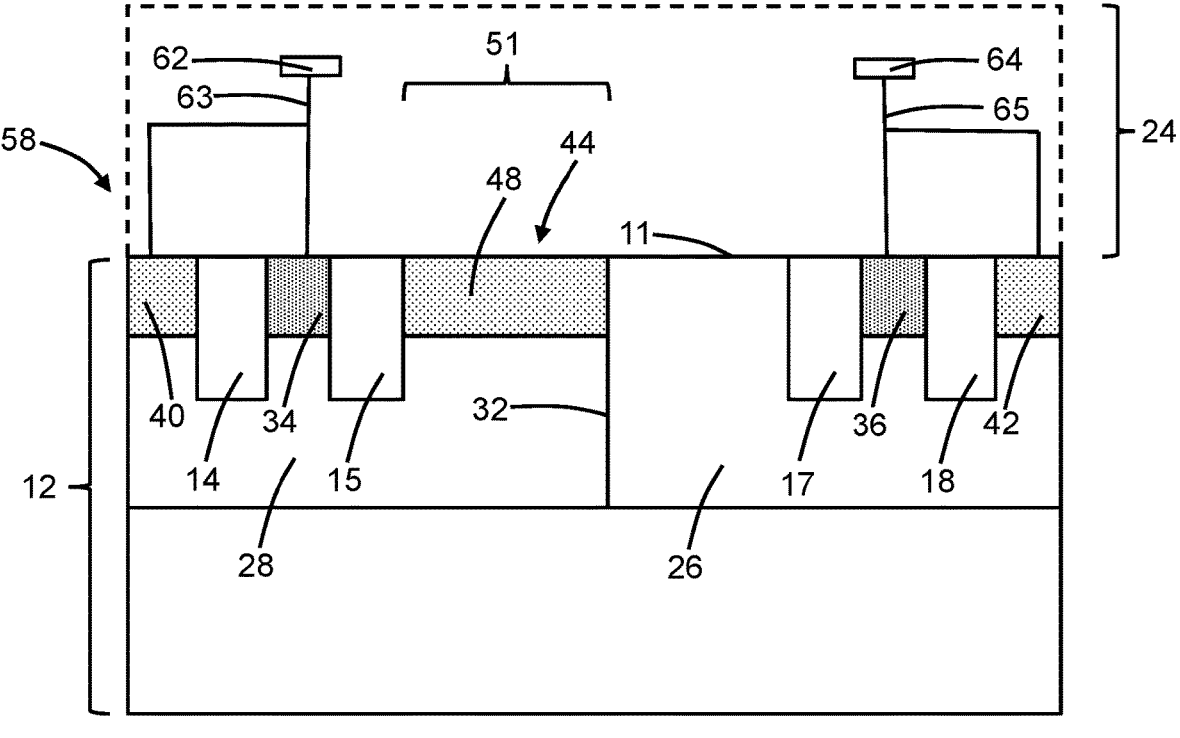
FIG. 5A is a cross-sectional view taken generally along line 5A-5A in FIG. 5.

With reference to FIGS. 5, 5A and in accordance with alternative embodiments of the invention, a structure 58 for a unidirectional silicon-controlled rectifier may eliminate the doped region 46 of the structure 56 (FIG. 4) such that only the doped region 44 remains. The deep well 20 and the well 30 are also eliminated, and the doped regions 36, 42 of the terminal 64 are positioned in the well 26. The shallow trench isolation region 16 is also eliminated such that the segments 48 of the doped region 44 are positioned in a lateral direction between the shallow trench isolation region 15 and the shallow trench isolation region 17. The segments 48 of the doped region 44 include the portions 51 that provide the localized abrupt junctions with the well 26 along the interface 32, as well as the portions 50 that are wider than the portions 51 and bridge across the interface 32.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a silicon-controlled rectifier, the structure comprising:
    a semiconductor substrate;
    a first well in the semiconductor substrate, the first well having a first conductivity type;
    a second well in the semiconductor substrate, the second well having the first conductivity type;
    a third well in the semiconductor substrate, the third well having a second conductivity type opposite to the first conductivity type, and the third well positioned between the first well and the second well;
    a first shallow trench isolation region in the third well in the semiconductor substrate;
    a second shallow trench isolation region in the semiconductor substrate;
    a first terminal including a first doped region in the first well, the first doped region having the second conductivity type;
    a second terminal including a second doped region in the second well, the second doped region having the first conductivity type; and
    a third doped region in the third well, the third doped region including a first segment and a second segment, the first segment separated from the second segment by a portion of the first well and a first portion of the third well, and the first segment and the second segment of the third doped region positioned between the first shallow trench isolation region and the second shallow trench isolation region,
    wherein the first well adjoins the third well at a p-n junction that is positioned between the first shallow trench isolation region and the second shallow trench isolation region, and the first segment and the second segment each include a first portion that extends from the first shallow trench isolation region to the p-n junction.

2. The structure of claim 1 wherein the first portion of the first segment and the first portion of the second segment abut the respective portions of the first well at the p-n junction.

3. The structure of claim 1 wherein the first segment and the second segment each include a second portion that extends fully from the first shallow trench isolation region to the second shallow trench isolation region.

4. The structure of claim 3 wherein the second portion of the first segment and the second portion of the second segment extend across the p-n junction to be located in part in the first well and in part in the third well.

5. The structure of claim 1 wherein the first segment and the second segment have the second conductivity type.

6. The structure of claim 1 wherein the third doped region is configured to be electrically floating.

7. The structure of claim 1 further comprising:

a fourth doped region in the third well, the fourth doped region including a third segment and a fourth segment, and the third segment separated from the fourth segment by a portion of the second well and a second portion of the third well.

8. The structure of claim 7 wherein the first shallow trench isolation region is positioned in the third well between the third doped region and the fourth doped region.

9. The structure of claim 8 further comprising:

a third shallow trench isolation region in the semiconductor substrate, wherein the third doped region is positioned between the first shallow trench isolation region and the second shallow trench isolation region, and the fourth doped region is positioned between the first shallow trench isolation region and the third shallow trench isolation region.

10. The structure of claim 2 wherein the first segment and the second segment each include a second portion that extends fully from the first shallow trench isolation region to the second shallow trench isolation region.

11. The structure of claim 2 wherein the first segment and the second segment have the second conductivity type.

12. The structure of claim 2 wherein the third doped region is configured to be electrically floating.

13. The structure of claim 3 wherein the third doped region is configured to be electrically floating.

14. The structure of claim 8 wherein the third doped region is configured to be electrically floating.

15. The structure of claim 9 wherein the third doped region is configured to be electrically floating.

16. A method of forming a structure for a silicon-controlled rectifier, the method comprising:

forming a first well and a second well in a semiconductor substrate, wherein the first well and the second well have a first conductivity type;

forming a third well in the semiconductor substrate, wherein the third well has a second conductivity type opposite to the first conductivity type, and the third well is positioned between the first well and the second well;

forming a first shallow trench isolation region in the third well in the semiconductor substrate;

forming a second shallow trench isolation region in the semiconductor substrate;

forming a first terminal including a first doped region in the first well, wherein the first doped region has the second conductivity type;

forming a second terminal including a second doped region in the second well, wherein the second doped region has the first conductivity type; and forming a third doped region in the third well, wherein the third doped region includes a first segment and a second segment, and the first segment is separated from the second segment by a portion of the first well and a first portion of the third well, the first segment and the second segment of the third doped region are positioned between the first shallow trench isolation region and the second shallow trench isolation region, the first well adjoins the third well at a p-n junction that is positioned between the first shallow trench isolation region and the second shallow trench isolation region, and the first segment and the second segment each include a portion that extends from the first shallow trench isolation region to the p-n junction.

17. The structure of claim 10 wherein the second portion of the first segment and the second portion of the second segment extend across the p-n junction to be located in part in the first well and in part in the third well.

18. The structure of claim 10 wherein the third doped region is configured to be electrically floating.

19. The method of claim 16 wherein the third doped region is configured to be electrically floating.

20. The method of claim 16 wherein the first segment and the second segment have the second conductivity type.

* * * * *